(12) United States Patent　　　　　(10) Patent No.:　US 12,656,385 B2
Miyazaki　　　　　　　　　　　　　　 (45) Date of Patent:　　Jun. 16, 2026

(54) TRANSFORMER TURNS NUMBER TESTING CIRCUIT

(71) Applicant: SUMIDA CORPORATION, Tokyo (JP)

(72) Inventor: Hiroyuki Miyazaki, Natori City (JP)

(73) Assignee: SUMIDA CORPORATION (JP)

( * ) Notice: Subject to any disclaimer, the term of this patent is extended or adjusted under 35 U.S.C. 154(b) by 123 days.

(21) Appl. No.: 18/698,628

(22) PCT Filed: Aug. 8, 2022

(86) PCT No.: PCT/JP2022/030217
§ 371 (c)(1),
(2) Date: Apr. 4, 2024

(87) PCT Pub. No.: WO2023/084852
PCT Pub. Date: May 19, 2023

(65) Prior Publication Data
US 2024/0418760 A1　　　Dec. 19, 2024

(30) Foreign Application Priority Data

Nov. 11, 2021　　(JP) .................................. 2021-183878

(51) Int. Cl.
*G01R 29/20*　　　　　(2006.01)
(52) U.S. Cl.
CPC .................................... *G01R 29/20* (2013.01)
(58) Field of Classification Search
CPC .. G01R 29/20; G01R 19/16576; G01R 19/22; G01R 19/008; G01R 31/62; G01R 27/02; H01F 30/10
(Continued)

(56) References Cited

U.S. PATENT DOCUMENTS 4,439,724 A　　3/1984　Morong, III
4,990,860 A　*　2/1991　Peterson ................ G01R 29/20
　　　　　　　　　　　　　　　　　　324/225
(Continued)

FOREIGN PATENT DOCUMENTS

JP　　　S0509323 B1　　4/1975
JP　　　S51147758 A　　12/1976
(Continued)

OTHER PUBLICATIONS

International Search Report (Japanese and English) and Written Opinion (Japanese) of the International Searching Authority issued in PCT/JP2022/030217, mailed Sep. 20, 2022; ISA/JP (9 pages).
(Continued)

*Primary Examiner* — Christopher P Mcandrew
(74) *Attorney, Agent, or Firm* — Harness, Dickey & Pierce, P.L.C.

(57)　　　　　　　　ABSTRACT

Provided is a circuit capable of accurately testing the number of coil turns even with a transformer having a high turns ratio. A transformer turns number testing circuit is able to connect primary-side coils and secondary-side coils of a reference transformer and a to-be-tested transformer in phase and in series, and includes: a reference-side resistance element included in a reference-side loop circuit formed between both ends of the secondary-side coil of the reference transformer; a to-be-tested-side resistance element included in a to-be-tested-side loop circuit formed between both ends of the secondary-side coil of the to-be-tested transformer; and a voltage detector provided in a common line of the reference-side loop circuit and the to-be-tested-side loop circuit, the common line connecting a midpoint between the secondary-side coils of the reference transformer and the to-be-tested transformer and a midpoint (Continued)

between the reference-side resistance element and the to-be-tested-side resistance element.

5 Claims, 5 Drawing Sheets

(58) Field of Classification Search
USPC ......................................................... 324/726
See application file for complete search history.

(56) References Cited

U.S. PATENT DOCUMENTS 6,674,290 B2 * 1/2004 Wang .................... G01R 31/001
                                                        324/528
7,106,078 B1 * 9/2006 Frank ..................... G01R 27/02
                                                        324/726
9,726,706 B1 * 8/2017 Zhang ................... H02H 7/042

2003/0030433 A1 * 2/2003 Migliori ............. G01N 27/9046
                                                            324/220
2014/0118015 A1 * 5/2014 Milner, Jr. ............. G01R 31/62
                                                            324/726
2016/0209457 A1 * 7/2016 Lehmann ............... G01D 18/00
2018/0138803 A1 * 5/2018 Iyasu ................ H02M 3/33592
2019/0227108 A1 * 7/2019 Iwanusiw .............. G01R 29/20
2020/0249259 A1 * 8/2020 Peng ..................... G01R 27/16

FOREIGN PATENT DOCUMENTS

JP        S5938667 A    3/1984
JP        H11142459 A   5/1999
JP        3168999 U     7/2011

OTHER PUBLICATIONS

Office Action issued in the corresponding Korean Patent Application No. 10-2024-7013324; issued Dec. 5, 2025 (10 pages).

* cited by examiner

FIG.4

| SECONDARY-SIDE COIL | Sample | Vr1 Vrms | Vr2 Vrms | Vns1 Vrms | Vns2 Vrms | Vrd Vrms |
|---|---|---|---|---|---|---|
| 198T | 198T-01 | 3.969 | 4.022 | 1.804 | 8.490 | 4.457 |
| | 198T-02 | 3.979 | 4.022 | 1.918 | 8.831 | 4.753 |
| | 198T-03 | 3.985 | 4.020 | 1.922 | 9.105 | 4.990 |
| 199T | 199T-01 | 3.995 | 3.982 | 2.044 | 6.338 | 2.269 |
| | 199T-02 | 3.983 | 4.007 | 1.783 | 6.740 | 2.687 |
| | 199T-03 | 3.974 | 4.001 | 2.112 | 6.415 | 2.372 |
| 200T | 200T-02 | 3.973 | 3.980 | 3.995 | 4.162 | 0.125 |
| | 200T-03 | 3.973 | 3.983 | 3.879 | 4.293 | 0.261 |
| 201T | 201T-01 | 3.984 | 3.971 | 6.363 | 1.975 | 2.440 |
| | 201T-02 | 3.975 | 3.980 | 5.940 | 2.306 | 2.013 |
| | 201T-03 | 3.975 | 3.963 | 6.278 | 1.987 | 2.350 |
| 202T | 202T-01 | 3.986 | 3.958 | 8.395 | 1.439 | 4.474 |
| | 202T-02 | 3.971 | 3.940 | 8.272 | 1.421 | 4.413 |
| | 202T-03 | 3.969 | 3.949 | 8.396 | 1.464 | 4.534 |

TRANSFORMER TURNS NUMBER TESTING CIRCUIT

CROSS REFERENCE TO RELATED APPLICATIONS

This application is a 371 U.S. National Phase of International Application No. PCT/JP2022/030217, filed on Aug. 8, 2022, which claims priority to Japanese Patent Application No. 2021-183878, filed Nov. 11, 2021. The entire disclosures of the above applications are incorporated herein by reference.

BACKGROUND

Technical Field

The present invention relates to a circuit that tests the number of coil turns of a transformer.

Related Art

In transformers, a voltage transformation ratio or a current transformation ratio changes depending on a turns ratio between a primary-side coil and a secondary-side coil. Therefore, in order to maintain the quality of a transformer, it is necessary that the primary-side and secondary-side coils (windings) of the transformer have an appropriate number of turns as specified.

JP S59-38667 A discloses a testing device for an electromagnetic coil turns ratio in which secondary sides of a to-be-tested transformer and a standard transformer, primary sides of which are connected to an AC power supply, are connected so that induced voltages are in opposite directions, and a differential voltage thereof is amplified and extracted.

However, the above-described testing device may not be able to accurately perform testing in a transformer having a high turns ratio such as a current transformer and a high-voltage transformer. For example, it is difficult to detect a difference of one turn in a transformer having a turns ratio of 200 to 1, 400 to 1, or the like.

The present invention provides a circuit capable of accurately testing the number of coil turns even with a transformer having a high turns ratio.

SUMMARY

The present invention provides a transformer turns number testing circuit capable of testing the number of coil turns of a to-be-tested transformer based on a reference transformer, the transformer turns number testing circuit being configured to be able to supply AC power to primary-side coils of the reference transformer and the to-be-tested transformer, the transformer turns number testing circuit being configured to be able to connect the primary-side coils of the reference transformer and the to-be-tested transformer in phase and in series and connect secondary-side coils of the reference transformer and the to-be-tested transformer in phase and in series, the transformer turns number testing circuit including: a reference-side resistance element included in a reference-side loop circuit formed between both ends of the secondary-side coil of the reference transformer; a to-be-tested-side resistance element included in a to-be-tested-side loop circuit formed between both ends of the secondary-side coil of the to-be-tested transformer; and a voltage detector provided in a common line of the reference-side loop circuit and the to-be-tested-side loop circuit, the common line connecting a midpoint between the secondary-side coils of the reference transformer and the to-be-tested transformer and a midpoint between the reference-side resistance element and the to-be-tested-side resistance element.

Effect of the Invention

According to the above aspect, it is possible to provide a circuit capable of accurately testing the number of coil turns even with a transformer having a high turns ratio.

BRIEF DESCRIPTION OF THE DRAWINGS

FIG. 4 is a table illustrating measurement results of voltages at respective points on a secondary side in the transformer turns number testing circuit of the first embodiment.

DETAILED DESCRIPTION

Hereinafter, examples of preferred embodiments of the present invention (hereinafter, referred to as the present embodiments) will be described. Note that the following embodiments are examples, and the present invention is not limited to the configurations of the following embodiments.

First Embodiment

Figure 1:
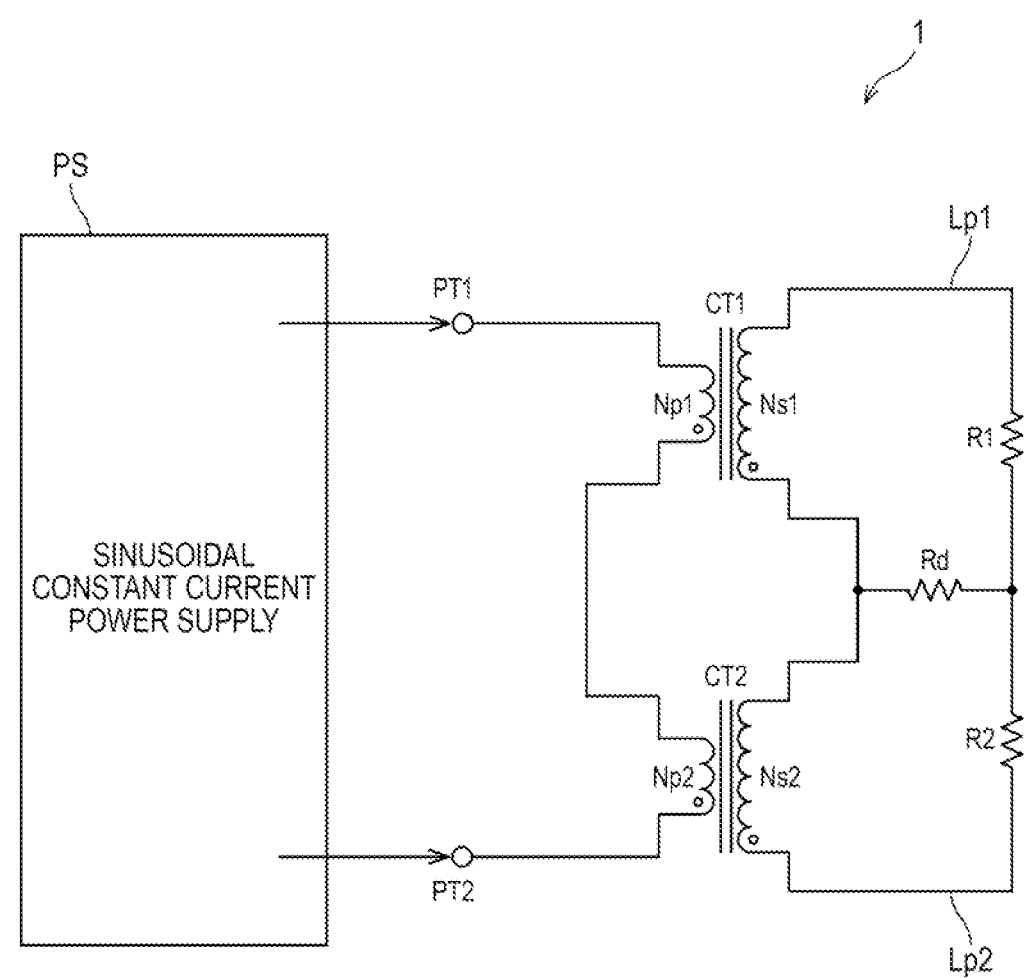
FIG. 1 is a circuit diagram of a transformer turns number testing circuit according to a first embodiment.

FIG. 1 is a circuit diagram of a transformer turns number testing circuit 1 according to a first embodiment.

The transformer turns number testing circuit 1 is a circuit capable of testing the number of coil turns of a to-be-tested transformer CT2 on the basis of a reference transformer CT1, and hereinafter, may be abbreviated as testing circuit 1. That is, the testing circuit 1 can test whether the number of coil turns of the to-be-tested transformer CT2 matches the number of coil turns of the reference transformer CT1.

In the present specification, the number of coil turns of the transformer means the number of turns of a primary-side coil and the number of turns of a secondary-side coil of the transformer, or a turns ratio between the primary-side coil and the secondary-side coil of the transformer.

According to the present embodiment, even when the reference transformer CT1 and the to-be-tested transformer CT2 are transformers having a relatively high turns ratio such as a current transformer, a high-voltage transformer, and a step-up transformer, or other transformers having a low turns ratio, testing can be performed.

In the present embodiment, it is assumed that the reference transformer CT1 and the to-be-tested transformer CT2 are current transformers, and primary-side coils Np1 and Np2 of the respective transformers have the same number of coil turns.

[Circuit Configuration]

The testing circuit 1 is configured to be able to supply AC power to the primary-side coils Np1 and Np2 of the reference transformer CT1 and the to-be-tested transformer CT2. In the present embodiment, the testing circuit 1 includes power supply terminals PT1 and PT2 connectable to output terminals of a power supply that supplies AC power. In the example of FIG. 1, output terminals of a sinusoidal constant current power supply (hereinafter, may be abbreviated as power supply) PS are connected to the power supply terminals PT1 and PT2, respectively.

The power supply PS only needs to be able to supply constant AC power, and a specific specification thereof is not limited.

The testing circuit 1 may or may not include the power supply PS as a circuit component.

As illustrated in FIG. 1, the testing circuit 1 is configured to be able to connect the primary-side coils (Np1 and Np2) in the reference transformer CT1 and the to-be-tested transformer CT2 in phase and in series and connect secondary-side coils (Ns1 and Ns2) in the reference transformer CT1 and the to-be-tested transformer CT2 in phase and in series.

To "connect the coils in phase and in series" means that a positive terminal of one coil and a negative terminal of the other coil are connected in series so that the two coils have the same polarity (winding direction).

Therefore, in a state where the reference transformer CT1 and the to-be-tested transformer CT2 are connected to the testing circuit 1, the primary-side coils Np1 and Np2 are connected as follows. A negative terminal of the primary-side coil Np1 of the reference transformer CT1 is connected to a conducting wire connected to the power supply terminal PT1. A positive terminal of this primary-side coil Np1 and a negative terminal of the primary-side coil Np2 of the to-be-tested transformer CT2 are wired in series. A positive terminal of this primary-side coil Np2 is connected to a conducting wire connected to the power supply terminal PT2.

The testing circuit 1 includes, on secondary sides of the reference transformer CT1 and the to-be-tested transformer CT2, a reference-side loop circuit Lp1 formed between both ends of the secondary-side coil Ns1 of the reference transformer CT1 and a to-be-tested-side loop circuit Lp2 formed between both ends of the secondary-side coil Ns2 of the to-be-tested transformer CT2. The reference-side loop circuit Lp1 and the to-be-tested-side loop circuit Lp2 share some wiring, and the shared wiring is referred to as a common line.

In a state where the reference transformer CT1 and the to-be-tested transformer CT2 are connected to the testing circuit 1, a positive terminal and a negative terminal of the secondary-side coil Ns1 are connected to the reference-side loop circuit Lp1, and a positive terminal and a negative terminal of the secondary-side coil Ns2 are connected to the to-be-tested-side loop circuit Lp2 such that the positive terminal of the secondary-side coil Ns1 of the reference transformer CT1 and the negative terminal of the secondary-side coil Ns2 of the to-be-tested transformer CT2 are wired in series.

The testing circuit 1 may be configured such that the reference transformer CT1 is provided in a fixed manner, and only the to-be-tested transformer CT2 can be replaced with another to-be-tested transformer.

In this case, for example, the testing circuit 1 further includes a first connection terminal connected to the positive terminal of the primary-side coil Np1 of the reference transformer CT1, a second connection terminal connected to the power supply terminal PT2, and third and fourth connection terminals (not shown in the drawings) for connecting the secondary-side coil Ns2 of the to-be-tested transformer CT2 to the to-be-tested-side loop circuit Lp2. The third connection terminal to be connected to the negative terminal of the secondary-side coil Ns2 of the to-be-tested transformer CT2 is provided at one end of a conducting wire connected to the positive terminal of the secondary-side coil Ns1 of the reference transformer CT1.

The negative terminal of the primary-side coil Np2 of the to-be-tested transformer CT2 prepared for testing is connected to the above first connection terminal, and the positive terminal of this primary-side coil Np2 is connected to the above second connection terminal. Furthermore, the negative terminal of the secondary-side coil Ns2 of the to-be-tested transformer CT2 is connected to the above third connection terminal, and the positive terminal of this secondary-side coil Ns2 is connected to the above fourth connection terminal.

The testing circuit 1 may be configured such that the reference transformer CT1 can be replaced with another reference transformer as well as the to-be-tested transformer CT2. In this case, for example, a reference transformer having a turns ratio of 200 to 1 can be replaced with a reference transformer having a turns ratio of 400 to 1.

In this case, in addition to the first connection terminal to the fourth connection terminal described above, the testing circuit 1 further includes a fifth connection terminal connected to the power supply terminal PT1, a sixth connection terminal connected to the above first connection terminal, and seventh and eighth connection terminals (not shown in the drawings) for connecting the secondary-side coil Ns1 of the reference transformer CT1 to the reference-side loop circuit Lp1. The eighth connection terminal to be connected to the positive terminal of the secondary-side coil Ns1 of the reference transformer CT1 is provided at one end of a conducting wire connected to the negative terminal of the secondary-side coil Ns2 of the to-be-tested transformer CT2.

The negative terminal of the primary-side coil Np1 of the reference transformer CT1 prepared for replacement is connected to the above fifth connection terminal, and the positive terminal of this primary-side coil Np1 is connected to the above sixth connection terminal. Furthermore, the negative terminal of the secondary-side coil Ns1 of the reference transformer CT1 is connected to the above seventh connection terminal, and the positive terminal of this secondary-side coil Ns1 is connected to the above eighth connection terminal.

However, since it is only necessary that the primary-side coils (Np1 and Np2) in the reference transformer CT1 and the to-be-tested transformer CT2 can be connected in phase and in series, and the secondary-side coils (Ns1 and Ns2) in the reference transformer CT1 and the to-be-tested transformer CT2 can be connected in phase and in series, the primary-side coils Np1 and Np2 and the secondary-side coils Ns1 and Ns2 may be connected so as to have a polarity opposite to the polarity illustrated in FIG. 1.

The testing circuit 1 further includes a reference-side resistance element R1, a to-be-tested-side resistance element R2, and a voltage detection resistance element Rd.

The reference-side resistance element R1 is provided in the reference-side loop circuit Lp1 (other than the common line), and the to-be-tested-side resistance element R2 is provided in the to-be-tested-side loop circuit Lp2 (other than the common line).

The voltage detection resistance element Rd is provided in the common line of the reference-side loop circuit Lp1 and the to-be-tested-side loop circuit Lp2, the common line connecting a midpoint (connection point) between the secondary-side coils Ns1 and Ns2 of the reference transformer CT1 and the to-be-tested transformer CT2 and a midpoint between the reference-side resistance element R1 and the to-be-tested-side resistance element R2.

The reference-side resistance element R1 and the to-be-tested-side resistance element R2 are resistance elements having the same resistance value. The voltage detection resistance element Rd is a resistance element having a higher resistance value than the reference-side resistance element R1 and the to-be-tested-side resistance element R2.

[Operation]

Hereinafter, the operation of the testing circuit 1 according to the first embodiment having the above-described configuration will be described.

First, in a state where the reference transformer CT1 and the to-be-tested transformer CT2 are connected to the testing circuit 1 as illustrated in FIG. 1, the power supply PS supplies constant AC power to the primary-side coils Np1 and Np2 of the reference transformer CT1 and the to-be-tested transformer CT2. As a result, the same level of current flows through the primary-side coils Np1 and Np2.

When the current flows through the primary-side coils Np1 and Np2, a magnetic field is generated in each of the reference transformer CT1 and the to-be-tested transformer CT2, and an induced electromotive force is generated in the secondary-side coils Ns1 and Ns2. At this time, the power induced in the secondary-side coils Ns1 and Ns2 is amplified according to the turns ratio of the reference transformer CT1 and the turns ratio of the to-be-tested transformer CT2.

Here, in a case where the reference transformer CT1 and the to-be-tested transformer CT2 have the same number of coil turns, the same level of current according to the turns ratio of the transformers flows through the secondary-side coil Ns1 of the reference transformer CT1 and the secondary-side coil Ns2 of the to-be-tested transformer CT2.

As a result, a current flows through a loop circuit formed by the secondary-side coils Ns1 and Ns2, the reference-side resistance element R1, and the to-be-tested-side resistance element R2, and no current flows through the common line of the reference-side loop circuit Lp1 and the to-be-tested-side loop circuit Lp2. However, the expression "no current flows" means that a current does not completely flow in an ideal circuit, but allows a minute current to flow in an actual circuit. This minute current will be described in detail in the section of Examples.

As a result, no voltage is generated in the voltage detection resistance element Rd provided in the common line.

On the other hand, in a case where the reference transformer CT1 and the to-be-tested transformer CT2 have different numbers of coil turns, there is a difference in power induced in the secondary-side coils Ns1 and Ns2, which causes a difference in voltage applied to the reference-side resistance element R1 and the to-be-tested-side resistance element R2, and different levels of currents to flow through the reference-side loop circuit Lp1 and the to-be-tested-side loop circuit Lp2.

As a result, a current also flows through the common line, and a voltage is generated in the voltage detection resistance element Rd.

As described above, in the present embodiment, the voltage detection resistance element Rd detects a potential difference between the midpoint (connection point) between the secondary-side coils Ns1 and Ns2 of the reference transformer CT1 and the to-be-tested transformer CT2 and the midpoint between the reference-side resistance element R1 and the to-be-tested-side resistance element R2. In addition, in a case where the reference transformer CT1 and the to-be-tested transformer CT2 have different numbers of coil turns, a phase difference is generated between the voltage generated in the secondary-side coil Ns1 and the voltage generated in the secondary-side coil Ns2. Therefore, the voltage detection resistance element Rd can also detect the phase difference.

In addition, the resistance values of the reference-side resistance element R1 and the to-be-tested-side resistance element R2 are the same and the resistance value of the voltage detection resistance element Rd is set higher than these resistance values. This makes it possible to prevent the voltage detection resistance element Rd from detecting a potential difference at an error level not related to the numbers of coil turns of the reference transformer CT1 and the to-be-tested transformer CT2.

Therefore, according to the present embodiment, by detecting the voltage generated in the voltage detection resistance element Rd, it is possible to test whether the number of coil turns of the to-be-tested transformer CT2 matches the number of coil turns of the reference transformer CT1. Furthermore, by providing the voltage detection resistance element Rd in the common line of the reference-side loop circuit Lp1 and the to-be-tested-side loop circuit Lp2, it is possible to detect a voltage phase difference and a current level difference, and thus, it is possible to accurately test the number of coil turns even with a transformer having a high turns ratio.

Second Embodiment

Figure 2:
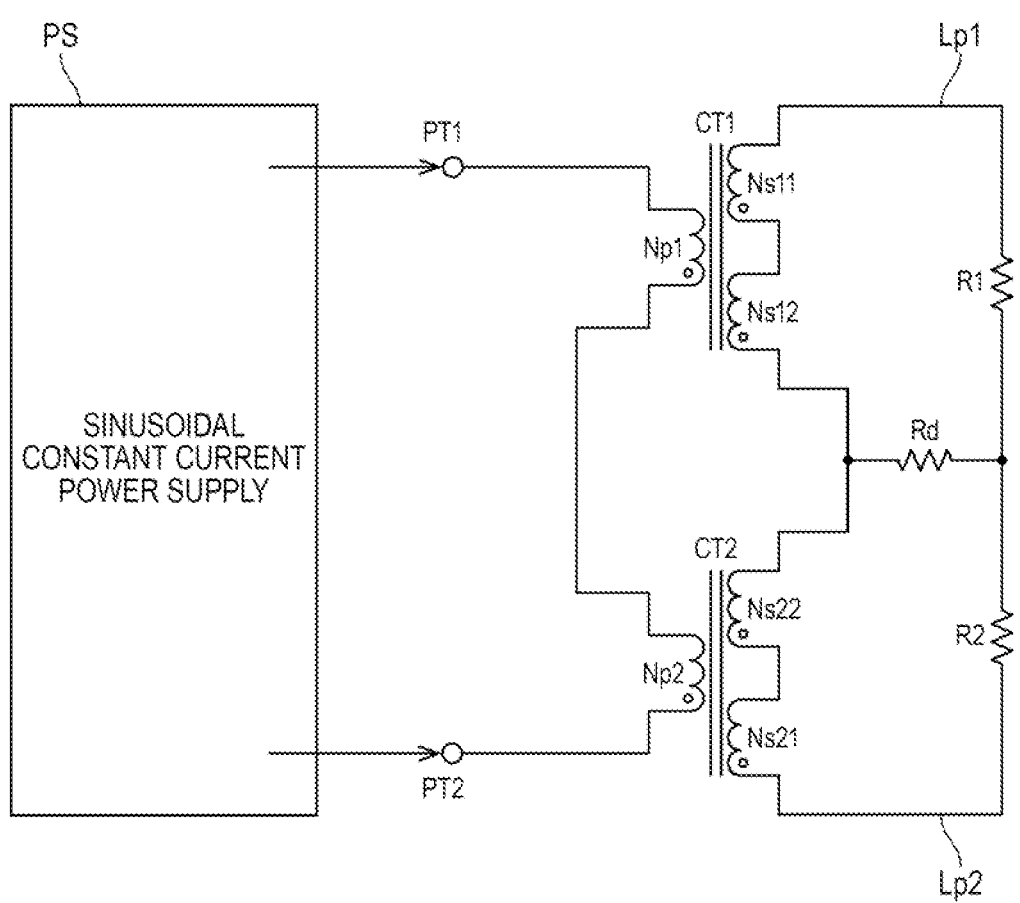
FIG. 2 is a circuit diagram of a transformer turns number testing circuit according to a second embodiment.

FIG. 2 is a circuit diagram of a testing circuit 1 according to a second embodiment.

The second embodiment differs from the first embodiment in that a reference transformer CT1 and a to-be-tested transformer CT2 include a plurality of secondary-side coils.

Hereinafter, the testing circuit 1 according to the second embodiment will be described focusing on contents different from those of the first embodiment, and the same contents as those of the first embodiment will not be repeated.

In the example of FIG. 2, each of the reference transformer CT1 and the to-be-tested transformer CT2 includes two secondary-side coils (Ns11 and Ns12) and (Ns21 and Ns22).

The testing circuit 1 according to the second embodiment is configured to be able to connect all the secondary-side coils Ns11, Ns12, Ns21, and Ns22 of the reference transformer CT1 and the to-be-tested transformer CT2 in phase and in series. Specifically, a positive terminal of the secondary-side coil Ns11 and a negative terminal of the secondary-side coil Ns12 of the reference transformer CT1 are wired in series. A positive terminal of this secondary-side coil Ns12 and a negative terminal of the secondary-side coil Ns22 of the to-be-tested transformer CT2 are wired in series. A positive terminal of this secondary-side coil Ns22 and a negative terminal of the secondary-side coil Ns21 are wired in series. In addition, a negative terminal of the secondary-side coil Ns11 of the reference transformer CT1 and the positive terminal of the secondary-side coil Ns12 of the reference transformer CT1 are connected to the reference-side loop circuit Lp1. The negative terminal of the secondary-side coil Ns22 of the to-be-tested transformer CT2 and a positive terminal of the secondary-side coil Ns21 of the to-be-tested transformer CT2 are connected to the to-be-tested-side loop circuit Lp2.

According to such a circuit configuration, in a case where the ratio of the total number of turns of the secondary-side coils to the number of turns of the primary-side coil does not match between the reference transformer CT1 and the to-be-tested transformer CT2, a current flows through the common line of the reference-side loop circuit Lp1 and the to-be-tested-side loop circuit Lp2, and a voltage is generated in the voltage detection resistance element Rd.

As a result, even in a case where a transformer including a plurality of secondary-side coils is to be tested, it is possible to test whether the number of coil turns of the to-be-tested transformer CT2 matches the number of coil turns of the reference transformer CT1 by detecting the voltage of the voltage detection resistance element Rd.

In the example of FIG. 2, the transformer having the two secondary-side coils is targeted. However, even with a transformer having three or more secondary-side coils, the same effect can be obtained by connecting the three or more secondary-side coils in phase and in series.

Third Embodiment

Figure 3:
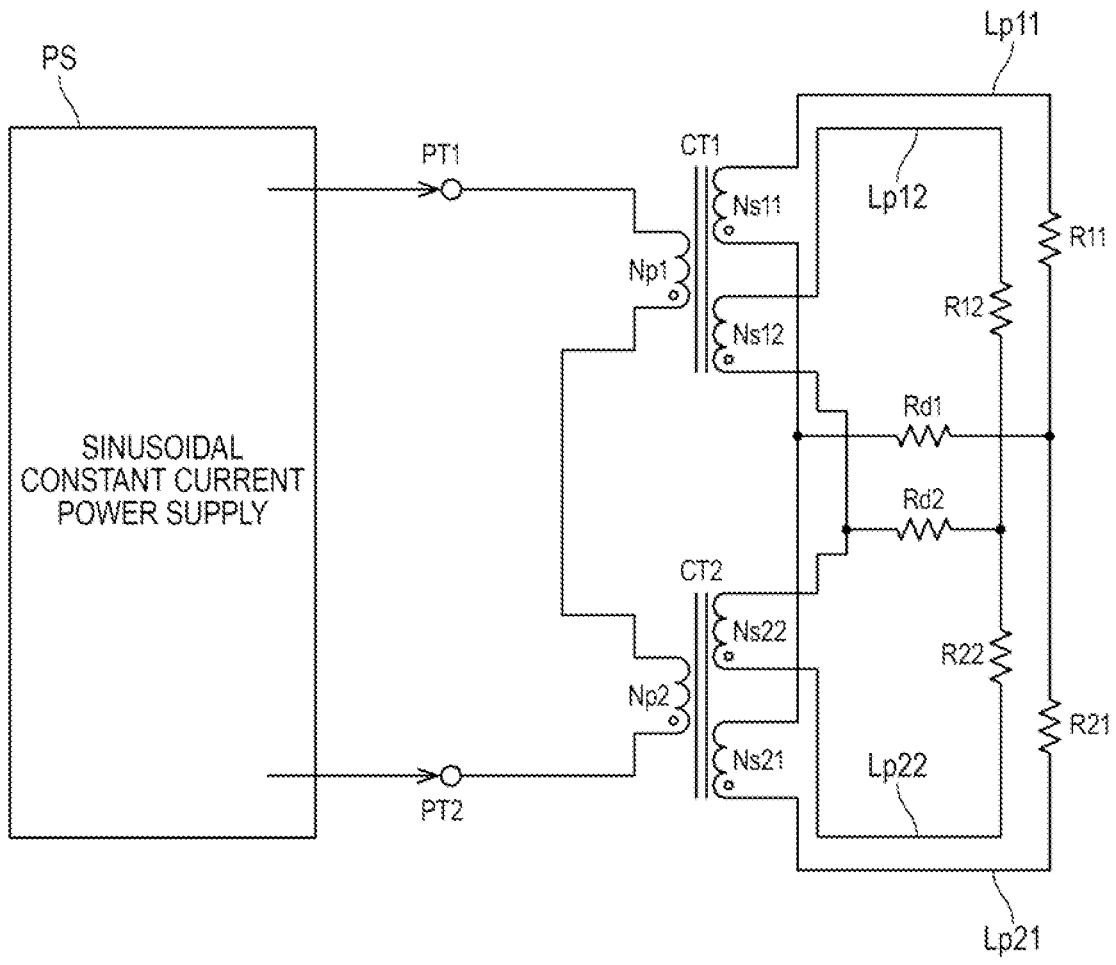
FIG. 3 is a circuit diagram of a transformer turns number testing circuit according to a third embodiment.

FIG. 3 is a circuit diagram of a testing circuit 1 according to a third embodiment.

Similarly to the second embodiment, the third embodiment is a mode in which a reference transformer CT1 and a to-be-tested transformer CT2 have a plurality of secondary-side coils, but have a circuit configuration different from that of the second embodiment.

Hereinafter, the testing circuit 1 according to the third embodiment will be described focusing on contents different from those of the first embodiment and the second embodiment, and the same contents as those of the first embodiment or the second embodiment will not be repeated.

In the example of FIG. 3, each of the reference transformer CT1 and the to-be-tested transformer CT2 includes two secondary-side coils (Ns11 and Ns12) and (Ns21 and Ns22) similarly to FIG. 2.

The testing circuit 1 according to the third embodiment is configured to be able to connect one secondary-side coil Ns11 of the reference transformer CT1 and one secondary-side coil Ns21 of the to-be-tested transformer CT2 in phase and in series, and connect the other secondary-side coil Ns12 of the reference transformer CT1 and the other secondary-side coil Ns22 of the to-be-tested transformer CT2 in phase and in series.

In addition, the testing circuit 1 is configured such that one loop circuit is formed for each secondary-side coil of the reference transformer CT1 and the to-be-tested transformer CT2. Specifically, a reference-side loop circuit Lp11 is formed between both ends of the secondary-side coil Ns11 of the reference transformer CT1. A reference-side loop circuit Lp12 is formed between both ends of the secondary-side coil Ns12 of the reference transformer CT1. A to-be-tested-side loop circuit Lp21 is formed between both ends of the secondary-side coil Ns21 of the to-be-tested transformer CT2. A to-be-tested-side loop circuit Lp22 is formed between both ends of the secondary-side coil Ns22 of the to-be-tested transformer CT2.

As a result, the reference-side loop circuit Lp11 and the to-be-tested-side loop circuit Lp21 formed between the both ends of the secondary-side coil Ns11 and formed between the both ends of the secondary-side coil Ns21, the secondary-side coil Ns11 and the secondary-side coil Ns21 being connected in phase and in series, partially include a common line. Similarly, the reference-side loop circuit Lp12 and the to-be-tested-side loop circuit Lp22 formed between the both ends of the secondary-side coil Ns12 and formed between the both ends of the secondary-side coil Ns22, the secondary-side coil Ns12 and the secondary-side coil Ns22 being connected in phase and in series, partially include a common line.

Furthermore, the testing circuit 1 according to the third embodiment includes the same number of reference-side resistance elements, to-be-tested-side resistance elements, and voltage detection resistance elements as the number of secondary-side coils of each transformer. Specifically, the testing circuit 1 includes two reference-side resistance elements R11 and R12, two to-be-tested-side resistance elements R21 and R22, and two voltage detection resistance elements Rd1 and Rd2.

The reference-side resistance element R11 is provided in the reference-side loop circuit Lp11. The reference-side resistance element R12 is provided in the reference-side loop circuit Lp12. The to-be-tested-side resistance element R21 is provided in the to-be-tested-side loop circuit Lp21. The to-be-tested-side resistance element R22 is provided in the to-be-tested-side loop circuit Lp22.

The voltage detection resistance element Rd1 is provided in the common line of the reference-side loop circuit Lp11 and the to-be-tested-side loop circuit Lp21, the common line connecting a midpoint between the secondary-side coils Ns11 and Ns21 of the reference transformer CT1 and the to-be-tested transformer CT2 connected in phase and in series and a midpoint between the reference-side resistance element R11 and the to-be-tested-side resistance element R21. The voltage detection resistance element Rd2 is provided in the common line of the reference-side loop circuit Lp12 and the to-be-tested-side loop circuit Lp22, the common line connecting a midpoint between the secondary-side coils Ns12 and Ns22 of the reference transformer CT1 and the to-be-tested transformer CT2 connected in phase and in series and a midpoint between the reference-side resistance element R12 and the to-be-tested-side resistance element R22.

In the third embodiment, as described above, one loop circuit is formed for each secondary-side coil of the reference transformer CT1 and the to-be-tested transformer CT2, and a potential difference between the midpoint between each secondary-side coil of the reference transformer CT1 and each secondary-side coil of the to-be-tested transformer CT2 connected in phase and in series and the midpoint between the reference-side resistance element and the to-be-tested-side resistance element of each loop circuit is detected by the voltage detection resistance element provided in the common line of these loop circuits.

Therefore, according to the third embodiment, the numbers of coil turns of the plurality of secondary-side coils of the reference transformer CT1 and the to-be-tested transformer CT2 can be tested between the paired secondary-side coils of the respective transformers. For example, even in a case where the total number of turns of the plurality of secondary-side coils of the reference transformer CT1 is the same as the total number of turns of the plurality of secondary-side coils of the to-be-tested transformer CT2, but the number of turns of each of the secondary-side coils is different between the reference transformer CT1 and the to-be-tested transformer CT2, the difference in the number of turns can be accurately detected according to the third embodiment.

In the example of FIG. 3, the transformer having the two secondary-side coils is targeted. However, even with a transformer having three or more secondary-side coils, the same effect can be obtained by adopting the circuit configuration as described above. That is, the testing circuit 1 is configured to be able to connect each secondary-side coil of the reference transformer CT1 and each secondary-side coil of the to-be-tested transformer CT2 in phase and in series, to be able to form one reference-side loop circuit between the both ends of each secondary-side coil of the reference transformer CT1, and to be able to form one to-be-tested-side loop circuit between the both ends of each secondary-side coil of the to-be-tested transformer CT2, the reference-side resistance element being provided in each reference-side loop circuit, the to-be-tested-side resistance element being provided in each to-be-tested-side loop circuit, and the voltage detection resistance element being provided in the common line of the reference-side loop circuit and the to-be-tested-side loop circuit, the common line connecting the midpoint between the secondary-side coils of the reference transformer CT1 and the to-be-tested transformer CT2 connected in phase and in series and the midpoint between the reference-side resistance element provided in the reference-side loop circuit and the to-be-tested-side resistance element provided in the to-be-tested-side loop circuit.

Modification

Each of the testing circuits 1 in the above-described embodiments is an example. The testing circuit 1 in each of the above-described embodiments is not limited to the above-described configurations, and may be partially modified as appropriate.

For example, in each of the above-described embodiments, the voltage detection resistance element can be replaced with a transformer for voltage detection. For example, a primary-side coil of a voltage detection transformer may be disposed instead of the voltage detection resistance element of each of the above-described embodiments, and whether the number of coil turns of the to-be-tested transformer CT2 matches the number of coil turns of the reference transformer CT1 may be determined using a voltage detected by a secondary-side circuit of the voltage detection transformer.

The voltage detection resistance element in each of the above-described embodiments and the voltage detection transformer in the present modification can be referred to as a voltage detector.

Hereinafter, the above-described contents will be described in more detail with reference to examples. However, the description of the following examples does not add any limitation to the above-described contents.

Example 1

In Example 1, a result of demonstrating the effects of the above-described first embodiment will be described.

In Example 1, the testing circuit 1 of the first embodiment illustrated in FIG. 1 was used, and voltages applied to the secondary-side coils Ns1 and Ns2, the reference-side resistance element R1, the to-be-tested-side resistance element R2, and the voltage detection resistance element Rd were measured by inputting a rated current (frequency 100 kHz, 10 Arms) from the sinusoidal constant current power supply PS to the primary-side coils Np1 and Np2 of the reference transformer CT1 and the to-be-tested transformer CT2.

In addition, in Example 1, the reference transformer CT1 was a transformer with a turns ratio of 200 to 1, and the reference-side resistance element R1 and the to-be-tested-side resistance element R2 having a resistance value of 80Ω and the voltage detection resistance element Rd having a resistance value of 10 kΩ were adopted.

In addition, 14 kinds of sample transformers were prepared as the to-be-tested transformer CT2, and a voltage at each point was measured by sequentially replacing the prepared 14 kinds of sample transformers to be tested.

The 14 kinds of sample transformers are as follows.

Sample 198T-01=sample transformer with a turns ratio of 198 to 1

Sample 198T-02=sample transformer with a turns ratio of 198 to 1

Sample 198T-03=sample transformer with a turns ratio of 198 to 1

Sample 199T-01=sample transformer with a turns ratio of 199 to 1

Sample 199T-02=sample transformer with a turns ratio of 199 to 1

Sample 199T-03=sample transformer with a turns ratio of 199 to 1

Sample 200T-02=sample transformer with a turns ratio of 200 to 1

Sample 200T-03=sample transformer with a turns ratio of 200 to 1

Sample 201T-01=sample transformer with a turns ratio of 201 to 1

Sample 201T-02=sample transformer with a turns ratio of 201 to 1

Sample 201T-03=sample transformer with a turns ratio of 201 to 1

Sample 202T-01=sample transformer with a turns ratio of 202 to 1

Sample 202T-02=sample transformer with a turns ratio of 202 to 1

Sample 202T-03=sample transformer with a turns ratio of 202 to 1

As described above, in Example 1, it has been confirmed by actual measurement that a difference in the number of turns can be detected by preparing the plurality of sample transformers having different numbers of coil turns from the reference transformer CT1 by one to two turns.

FIG. 4 is a table illustrating measurement results of voltages at respective points on the secondary side in the transformer turns number testing circuit 1 of the first embodiment. In FIG. 4, a voltage (Vr1) actually measured at the reference-side resistance element R1, a voltage (Vr2) actually measured at the to-be-tested-side resistance element R2, a voltage (Vns1) actually measured at the secondary-side coil Ns1 of the reference transformer CT1, a voltage (Vns2) actually measured at the secondary-side coil Ns2 of the to-be-tested transformer CT2, and a voltage (Vrd) actually measured at the voltage detection resistance element Rd are each indicated by an effective value (Vrms).

As can be seen from FIG. 4, in a case where the sample transformers (200T-02 and 200T-03) having the same number of coil turns as the reference transformer CT1 are used as the to-be-tested transformer CT2, the voltages generated in the voltage detection resistance element Rd are 0.125 Vrms and 0.261 Vrms. On the other hand, in a case where the sample transformers having the number of coil turns larger or smaller than the reference transformer CT1 by one or more turns are used as the to-be-tested transformer CT2, the voltages generated in the voltage detection resistance element Rd are 2.013 Vrms or larger. That is, a large difference (about 10 times) appears in the voltage measured at the voltage detection resistance element Rd between the case where the number of coil turns of the to-be-tested transformer CT2 is the same as that of the reference transformer CT1 and the case where the number of coil turns of the to-be-tested transformer CT2 is different from that of the reference transformer CT1 even by one turn.

Therefore, according to Example 1, it has been demonstrated that whether or not the number of coil turns of the to-be-tested transformer CT2 matches the number of coil turns of the reference transformer CT1 can be tested using the voltage generated in the voltage detection resistance element Rd, and further, even a difference in the number of coil turns by one turn can be accurately detected in a transformer having a relatively high turns ratio.

Example 2

In Example 2, an application example of the testing circuit 1 of the above-described first embodiment will be described.

Figure 5:
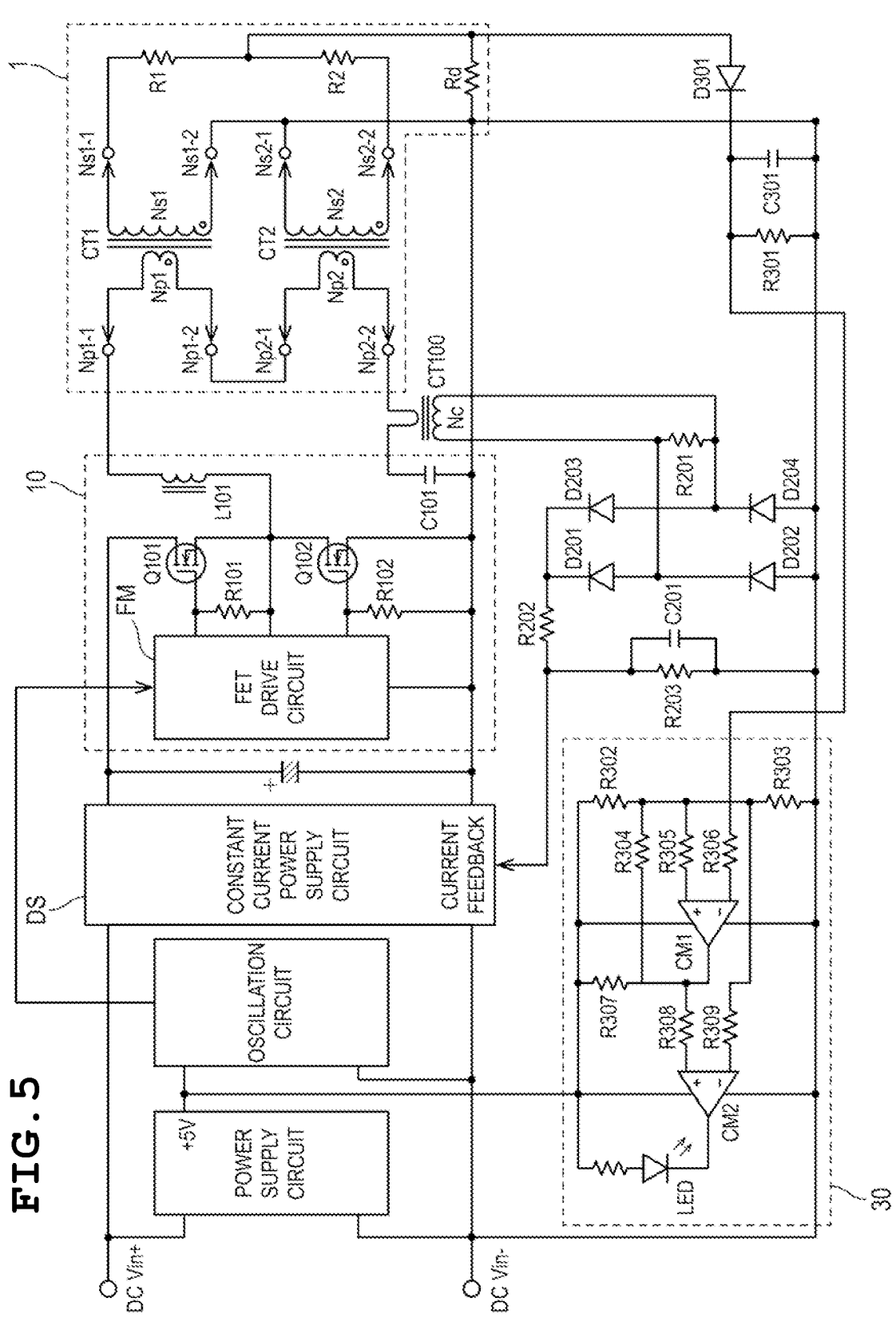
FIG. 5 is a circuit diagram of an application circuit of the transformer turns number testing circuit according to the first embodiment.

FIG. 5 is a circuit diagram of an application circuit of the transformer turns number testing circuit 1 according to the first embodiment. Hereinafter, the application circuit illustrated in FIG. 5 is referred to as the present application circuit.

The present application circuit includes the testing circuit 1 according to the first embodiment. The same components as those of the testing circuit 1 illustrated in FIG. 1 are denoted by the same reference numerals in FIG. 5.

A terminal Np1-1 corresponds to the power supply terminal PT1 of FIG. 1, and a terminal Np2-2 corresponds to the power supply terminal PT2 of FIG. 1. In addition, a terminal Np1-2 is a connection terminal connected to the positive pole side of the primary-side coil Np1 of the reference transformer CT1, and a terminal Np2-1 is a connection terminal connected to the negative pole side of the primary-side coil Np2 of the to-be-tested transformer CT2.

The present application circuit further includes a power supply circuit, an oscillation circuit, a constant current power supply circuit DS, and a series resonant half-bridge inverter circuit (hereinafter, may be abbreviated as inverter circuit) 10, and thereby supplies a sinusoidal constant current to the primary-side coils Np1 and Np2 of the reference transformer CT1 and the to-be-tested transformer CT2 in the testing circuit 1.

The inverter circuit 10 includes a Field Effect Transistor (FET) drive circuit FM, resistance elements R101 and R102, transistors Q101 and Q102, a capacitor C101, a coil L101, and the like.

The capacitor C101 and the coil L101 are connected in series via the primary-side coils Np1 and Np2 of the reference transformer CT1 and the to-be-tested transformer CT2, and constitute a series resonant circuit. The series resonant circuit is connected to a source of the transistor Q101, and is provided between a drain and a source of the transistor Q102. As a result, in a case where the transistor Q101 is in ON-state and the transistor Q102 is in OFF-state, a current flows from the coil L101 toward the capacitor C101, whereas in a case where the transistor Q101 is in OFF-state and the transistor Q102 is in ON-state, a current flows from the capacitor C101 toward the coil L101 by power stored in the capacitor C101.

As described above, the FET drive circuit FM alternately switches the transistors Q101 and Q102 between the ON state and the OFF state, thereby causing the capacitor C101 and the coil L101 to resonate and supplying a sinusoidal current to the primary-side coils Np1 and Np2.

The present application circuit further includes a circuit component that detects the current flowing from the inverter circuit 10 to the primary-side coils Np1 and Np2 and sends a feedback signal to the constant current power supply circuit DS. As such a circuit component, a current transformer CT100, resistance elements R201, R202, and R203, diodes D201, D202, D203, and D204, and a capacitor C201 are provided.

The current flowing from the inverter circuit 10 to the primary-side coils Np1 and Np2 also flows to a primary-side coil of the current transformer CT100, whereby a current corresponding to the coil turns ratio is also induced in a secondary-side coil Nc of the current transformer CT100. The AC power induced in the secondary-side coil Nc is rectified and smoothed by the resistance elements R201, R202, and R203, the diodes D201, D202, D203, and D204, and the capacitor C201, converted into a DC voltage, and fed back to the constant current power supply circuit DS as a DC voltage signal.

The constant current power supply circuit DS receives the feedback of the DC voltage signal and performs control so as to be able to provide constant power to the inverter circuit 10.

Furthermore, the present application circuit includes a circuit component that determines whether the number of coil turns of the to-be-tested transformer CT2 matches the number of coil turns of the reference transformer CT1 according to the voltage generated in the voltage detection resistance element Rd of the testing circuit 1, and presents a determination result. As such a circuit component, a diode D301, a coil C301, a resistance element R301, and a determination presentation circuit 30 are provided.

The AC voltage applied to the voltage detection resistance element Rd is rectified and smoothed by the diode D301, the coil C301, and the resistance element R301 to be converted into a DC voltage (hereinafter, may be referred to as a detected voltage), and input to the determination presentation circuit 30. Therefore, at least the diode D301 can be referred to as a rectifier circuit that rectifies the AC voltage detected by the voltage detection resistance element Rd and converts the AC voltage into a DC voltage.

In the determination presentation circuit 30, the detected voltage is input to an inversion terminal of a comparator CM1. Meanwhile, DC power supplied from the power supply circuit is divided by resistance elements R302 and R303 and input as a reference voltage to a non-inversion terminal of the comparator CM1 and an inversion terminal of a comparator CM2.

The comparator CM1 determines whether the level of the detected voltage is higher (HI) or lower (LOW) than the level of the reference voltage, and inputs HI/LOW to a non-inversion terminal of the comparator CM2. The comparator CM2 compares the HI/LOW output of the comparator CM1 with the reference voltage and outputs the result. An LED element is switched ON/OFF by the output of the comparator CM2.

Therefore, the comparators CM1 and CM2 can be referred to as a comparator that compares the DC voltage converted by the rectifier circuit with the reference voltage, and the LED element can be referred to as an output unit that outputs the testing result of the number of coil turns of the to-be-tested transformer on the basis of the output of the comparator.

As a result, in the present application circuit, in a case where the voltage detected by the voltage detection resistance element Rd is higher than a predetermined threshold, it is determined that the number of coil turns of the to-be-tested transformer CT2 does not match the number of coil turns of the reference transformer CT1, and the LED element is brought into ON state (turned ON). In a case where the voltage detected by the voltage detection resistance element Rd is lower than the predetermined threshold, it is determined that the number of coil turns of the to-be-tested transformer CT2 matches the number of coils turns of the reference transformer CT1, and the LED element is brought into OFF state (turned OFF).

Therefore, according to the present application circuit, it is possible to immediately determine whether or not the number of coil turns of the to-be-tested transformer CT2 matches the number of coil turns of the reference transformer CT1 by viewing a lighting state of the LED element.

In the application circuit of Example 2, the LED element is used as the output unit that outputs the testing result of the number of coil turns of the to-be-tested transformer, but other output units such as a sounding element that outputs the testing result as sound may be used.

Some or all of the above-described embodiments and modifications can also be specified as follows. However, the above-described embodiments and modifications are not limited to the following description.

(1)

A transformer turns number testing circuit capable of testing the number of coil turns of a to-be-tested transformer based on a reference transformer, the transformer turns number testing circuit being configured to be able to supply AC power to primary-side coils of the reference transformer and the to-be-tested transformer, the transformer turns number testing circuit being configured to be able to connect the primary-side coils of the reference transformer and the to-be-tested transformer in phase and in series and connect secondary-side coils of the reference transformer and the to-be-tested transformer in phase and in series, the transformer turns number testing circuit including:

a reference-side resistance element included in a reference-side loop circuit formed between both ends of the secondary-side coil of the reference transformer;

a to-be-tested-side resistance element included in a to-be-tested-side loop circuit formed between both ends of the secondary-side coil of the to-be-tested transformer; and a voltage detector provided in a common line of the reference-side loop circuit and the to-be-tested-side loop circuit, the common line connecting a midpoint between the secondary-side coils of the reference transformer and the to-be-tested transformer and a midpoint between the reference-side resistance element and the to-be-tested-side resistance element.

(2)

The transformer turns number testing circuit according to (1), wherein the to-be-tested-side resistance element has a resistance value equal to a resistance value of the reference-side resistance element, and the voltage detector is a resistance element having a higher resistance value than the reference-side resistance element and the to-be-tested-side resistance element.

(3)

The transformer turns number testing circuit according to (1) or (2), further including:

a rectifier circuit configured to rectify an AC voltage detected by the voltage detector to convert the AC voltage into a DC voltage;

a comparator configured to compare the DC voltage converted by the rectifier circuit with a reference voltage; and an output unit configured to output a testing result of the number of coil turns of the to-be-tested transformer based on an output of the comparator.

(4)

The transformer turns number testing circuit according to any one of (1) to (3), wherein each of the reference transformer and the to-be-tested transformer includes a plurality of secondary-side coils, the transformer turns number testing circuit is configured to be able to connect each pair of one secondary-side coil of the reference transformer and one secondary-side coil of the to-be-tested transformer in phase and in series, to be able to form reference-side loop circuits, each between both ends of each of the plurality of secondary-side coils of the reference transformer, and to be able to form to-be-tested-side loop circuits, each between both ends of each secondary-side coil of the to-be-tested transformer, the reference-side resistance element is provided in each of the reference-side loop circuits, the to-be-tested-side resistance element is provided in each of the to-be-tested-side loop circuits, and the voltage detector is provided in each of common lines of the reference-side loop circuits and the to-be-tested-side loop circuits, the common lines each connecting a midpoint between the secondary-side coils of the reference transformer and the to-be-tested transformer connected in phase and in series and a midpoint between the reference-side resistance element provided in the reference-side loop circuit and the to-be-tested-side resistance element provided in the to-be-tested-side loop circuit.

The invention claimed is:

1. A transformer turns number testing circuit capable of testing the number of coil turns of a to-be-tested transformer based on a reference transformer, the transformer turns number testing circuit being configured to be able to supply AC power to primary-side coils of the reference transformer and the to-be-tested transformer, the transformer turns number testing circuit being configured to be able to connect the primary-side coils of the reference transformer and the to-be-tested transformer in phase and in series and connect secondary-side coils of the reference transformer and the to-be-tested transformer in phase and in series, the transformer turns number testing circuit comprising:

a reference-side resistance element included in a reference-side loop circuit formed between both ends of the secondary-side coil of the reference transformer;

a to-be-tested-side resistance element included in a to-be-tested-side loop circuit formed between both ends of the secondary-side coil of the to-be-tested transformer; and a voltage detector provided in a common line of the reference-side loop circuit and the to-be-tested-side loop circuit, the common line connecting a midpoint between the secondary-side coils of the reference transformer and the to-be-tested transformer and a midpoint between the reference-side resistance element and the to-be-tested-side resistance element, wherein the to-be-tested-side resistance element has a resistance value equal to a resistance value of the reference-side resistance element, and the voltage detector is a resistance element having a higher resistance value than the reference-side resistance element and the to-be-tested-side resistance element.

2. The transformer turns number testing circuit according to claim 1, further comprising:

a rectifier circuit configured to rectify an AC voltage detected by the voltage detector to convert the AC voltage into a DC voltage;

a comparator configured to compare the DC voltage converted by the rectifier circuit with a reference voltage; and an output unit configured to output a testing result of the number of coil turns of the to-be-tested transformer based on an output of the comparator.

3. A transformer turns number testing circuit capable of testing the number of coil turns of a to-be-tested transformer based on a reference transformer, the transformer turns number testing circuit being configured to be able to supply AC power to primary-side coils of the reference transformer and the to-be-tested transformer, the transformer turns number testing circuit being configured to be able to connect the primary-side coils of the reference transformer and the to-be-tested transformer in phase and in series and connect secondary-side coils of the reference transformer and the to-be-tested transformer in phase and in series, the transformer turns number testing circuit comprising:

a reference-side resistance element included in a reference-side loop circuit formed between both ends of the secondary-side coil of the reference transformer;

a to-be-tested-side resistance element included in a to-be-tested-side loop circuit formed between both ends of the secondary-side coil of the to-be-tested transformer; and a voltage detector provided in a common line of the reference-side loop circuit and the to-be-tested-side loop circuit, the common line connecting a midpoint between the secondary-side coils of the reference transformer and the to-be-tested transformer and a midpoint between the reference-side resistance element and the to-be-tested-side resistance element, wherein each of the reference transformer and the to-be-tested transformer includes a plurality of secondary-side coils, the transformer turns number testing circuit is configured to be able to connect each pair of one secondary-side coil of the reference transformer and one secondary-side coil of the to-be-tested transformer in phase and in series, to be able to form reference-side loop circuits, each between both ends of each of the plurality of secondary-side coil of the reference transformer, and to be able to form to-be-tested-side loop circuits, each between both ends of each of the plurality of secondary-side coil of the to-be-tested transformer, the reference-side resistance element is provided in each of the reference-side loop circuits, the to-be-tested-side resistance element is provided in each of the to-be-tested-side loop circuits, and the voltage detector is provided in each of common lines of the reference-side loop circuits and the to-be-tested-side loop circuits, the common lines each connecting a midpoint between the secondary-side coils of the reference transformer and the to-be-tested transformer connected in phase and in series and a midpoint between the reference-side resistance element provided in the reference-side loop circuit and the to-be-tested-side resistance element provided in the to-be-tested-side loop circuit.

4. The transformer turns number testing circuit according to claim 3, wherein the to-be-tested-side resistance element has a resistance value equal to a resistance value of the reference-side resistance element, and the voltage detector is a resistance element having a higher resistance value than the reference-side resistance element and the to-be-tested-side resistance element.

5. The transformer turns number testing circuit according to claim 3, further comprising:

a rectifier circuit configured to rectify an AC voltage detected by the voltage detector to convert the AC voltage into a DC voltage;

a comparator configured to compare the DC voltage converted by the rectifier circuit with a reference voltage; and an output unit configured to output a testing result of the number of coil turns of the to-be-tested transformer based on an output of the comparator.

* * * * *